(12) United States Patent
Bernstein et al.

(10) Patent No.: US 7,460,422 B2
(45) Date of Patent: Dec. 2, 2008

(54) DETERMINING HISTORY STATE OF DATA BASED ON STATE OF PARTIALLY DEPLETED SILICON-ON-INSULATOR

(75) Inventors: Kerry Bernstein, Underhill, VT (US); Kenneth J. Goodnow, Essex Junction, VT (US); Clarence R. Ogilvis, Huntington, VT (US); Sebastian T. Ventrone, South Burlington, VT (US); Keith R. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 11/279,507

(22) Filed: Apr. 12, 2006

(65) Prior Publication Data

US 2007/0242507 A1    Oct. 18, 2007

(51) Int. Cl.
*G11C 7/00* (2006.01)
(52) U.S. Cl. .................. 365/201; 365/174; 365/177

(58) Field of Classification Search .............. 365/176, 365/201, 154, 227, 185.24, 222, 174, 183, 365/184; 326/33
See application file for complete search history.

(56) References Cited

U.S. PATENT DOCUMENTS

| 7,103,522 | B1 * | 9/2006 | Shepard ................. 703/14 |
| 2005/0040881 | A1 * | 2/2005 | Brown et al. .......... 327/534 |
| 2005/0248976 | A1 * | 11/2005 | Huang et al. .......... 365/149 |

* cited by examiner

*Primary Examiner*—Richard Elms
*Assistant Examiner*—Han Yang
(74) *Attorney, Agent, or Firm*—Michael LeStrange; Hoffman Warnick

(57) ABSTRACT

A system for determining a history state of data in a data retaining device are disclosed. A state of a partially-depleted silicon-on-insulator (PD SOI) device coupled to a data retaining device is measured to indicate a body voltage of the PD SOI device. The body voltage of the PD SOI device may indicate, among others, how long the PD SOI device has been idling, which indirectly indicates how long data in the data retaining device has not been accessed. As such, the current invention may be used efficiently with, e.g., a cache replacement algorithm in a management of the data retaining device.

7 Claims, 5 Drawing Sheets

DETERMINING HISTORY STATE OF DATA BASED ON STATE OF PARTIALLY DEPLETED SILICON-ON-INSULATOR

BACKGROUND OF THE INVENTION

1. Technical Field

The invention relates generally to a history state of data in data retaining device, and more particularly, to a method and system for determining a history state of data in a data retaining device based on a state of a partially depleted silicon-on-insulator (PD SOI) device coupled to the data retaining device.

2. Background Art

A history state of a piece of data in a data retaining device needs to be determined for various applications. A history state of data refers to a state of the data regarding any activities and inactivities (idling) that have been involved with the data since the data was stored in a data retaining device. For example, a multi-port cache is usually limited in size so that if the cache is full, some of the items in the cache need to be removed to make room for new items. A cache replacement algorithm is usually used to select items to be removed. Examples of cache replacement algorithms include a Least Recently Used (LRU) algorithm which discards the least recently used item first, and a Least Frequently Used (LFU) algorithm which discards the least frequently used item first. These algorithms require keeping track of a history state of the data, e.g., a history of the usage of the data.

For another instance, a history state of data may also need to be determined to monitor a validity of a particular machine state or a condition code in a processor. For example, to monitor whether a new clock cycle has been validly propagated into a latch, a history state of data retained in the latch needs to be determined.

According to the present state of the art technology, it is very expensive to determine a history state of data in a data retaining device. Based on the above, there is a need in the art for a solution to determine a history state of data in a data retaining device in an inexpensive/efficient way.

SUMMARY OF THE INVENTION

A system for determining a history state of data is disclosed. A state of a partially-depleted silicon-on-insulator (PD SOI) device coupled to a data retaining device is measured to indicate a body voltage of the PD SOI device. The body voltage of the PD SOI device may indicate, among others, how long the PD SOI device has been idling, which indirectly indicates how long data in the data retaining device has not been accessed. As such, the current invention may be used efficiently with, e.g., a cache replacement algorithm in a management of the data retaining device.

A first aspect of the invention provides a method for determining a history state of data in a data retaining device, the method comprising: providing the data retaining device, the data retaining device being coupled to a partially-depleted silicon-on-insulator (PD SOI) device; measuring a state of the PD SOI device, the state indicating a body voltage of the PD SOI device; and determining the history state of the data in the data retaining device based on the measured state of the PD SOI device.

A second aspect of the invention provides a system for determining a history state of data in a data retaining device, the system comprising: means for measuring a state of a partially-depleted silicon-on-insulator (PD SOI) device that is coupled to the data retaining device, the state indicating a body voltage of the PD SOI device; and means for determining the history state of the data in the data retaining device based on the measured state of the PD SOI device.

A third aspect of the invention provides a program product stored on a computer-readable medium, which when executed, enables a computer infrastructure to determine a history state of data in a data retaining device, the program product comprising computer program code for enabling the computer infrastructure to: control measuring a state of a partially-depleted silicon-on-insulator (PD SOI) device that is coupled to the data retaining device, the state indicating a body voltage of the PD SOI device; and determine the history state of the data in the data retaining device based on the measured state of the PD SOI device.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

1. General Description

Figure 1:
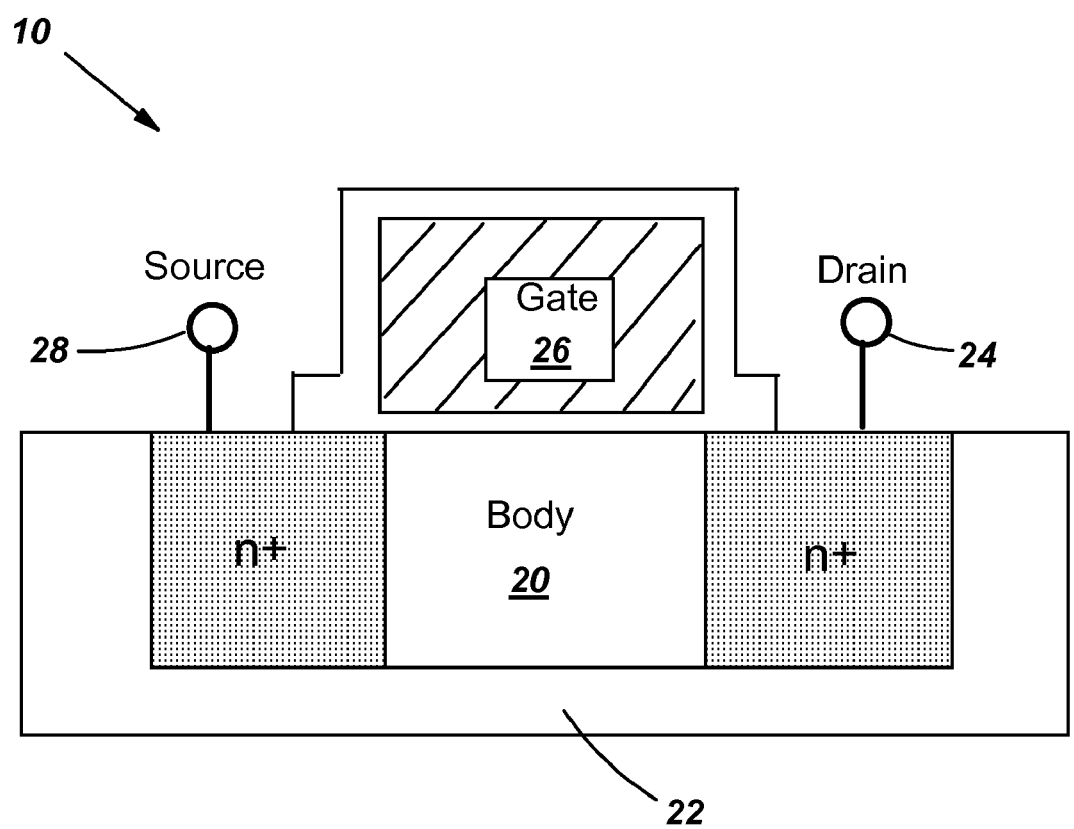
FIG. 1 shows an example of a partially depleted silicon-on-insulator (PD SOI) n-channel field-effect transistor (NFET) according to prior art.

The current invention takes advantage of the potential floating body effects, especially the history effects, of a partially depleted silicon-on-insulator (PD SOI) device that is coupled to a data retaining device to determine a history state of data stored in the data retaining device. FIG. 1 shows an example of a partially depleted silicon-on-insulator (PD SOI) n-channel field-effect transistor (NFET) 10. In PD SOI FET 10, as shown in FIG. 1, a body 20 is isolated by insulator 22 so that a potential of body 20, i.e., a body voltage, may vary with time, which is referred to as a floating body voltage. Factors contributing to the floating body voltage include coupling capacitance of body 20 with a drain 24, a gate 26 and a source 28, and charges that are stored in the body. PD SOI body 20 may be charged or discharged by activities involved with PD SOI FET 10 depending on, inter alia, the circuit topology, the process/device design details, and/or the relative magnitudes of the various charging/discharging mechanisms. For example, in the case that a PD SOI NFET is used as a pass gate, for each cycle of ON/OFF switches, the reverse-biased drain-to-body and source-to-body diodes may carry small diode leakage currents into body 20, i.e., a small amount of charge is injected into body 20. As a consequence, the body voltage of body 20 increases with each cycle of ON/OFF switch.

On the other hand, when pass gate PD SOI FET 10 idles, the body voltage reaches an equilibrium as, inter alia, the amount of charges exiting from the source-to-body diode equals the amount of charges entering from the drain-to-body diode. In addition, during a long period of idling, charges on body 20 further decay due to natural means. As a consequence of the decay, the body voltage equilibrium may drift either to the value of a positive power supply (VDD) or to the value of a ground (GND) depending on circuit designs.

As is appreciated, a threshold voltage of a PD SOI device, e.g., NFET 10, relates directly to the body voltage of the PD SOI device. Specifically, increase in the PD SOI body voltage causes decrease in the threshold voltage of PD SOI NFET 10; while decrease in the PD SOI body voltage causes increase in the threshold voltage of PD SOI NFET 10. In addition, a subthreshold leakage current of a PD SOI device, here, PD SOI NFET 10, depends upon the threshold voltage of the PD SOI device. An increase in the threshold voltage reduces the subthreshold leakage current. As such, a subthreshold leakage current of PD SOI NFET 10 may be used as an indicator of a body voltage of the same.

2. System Overview

Figure 2:
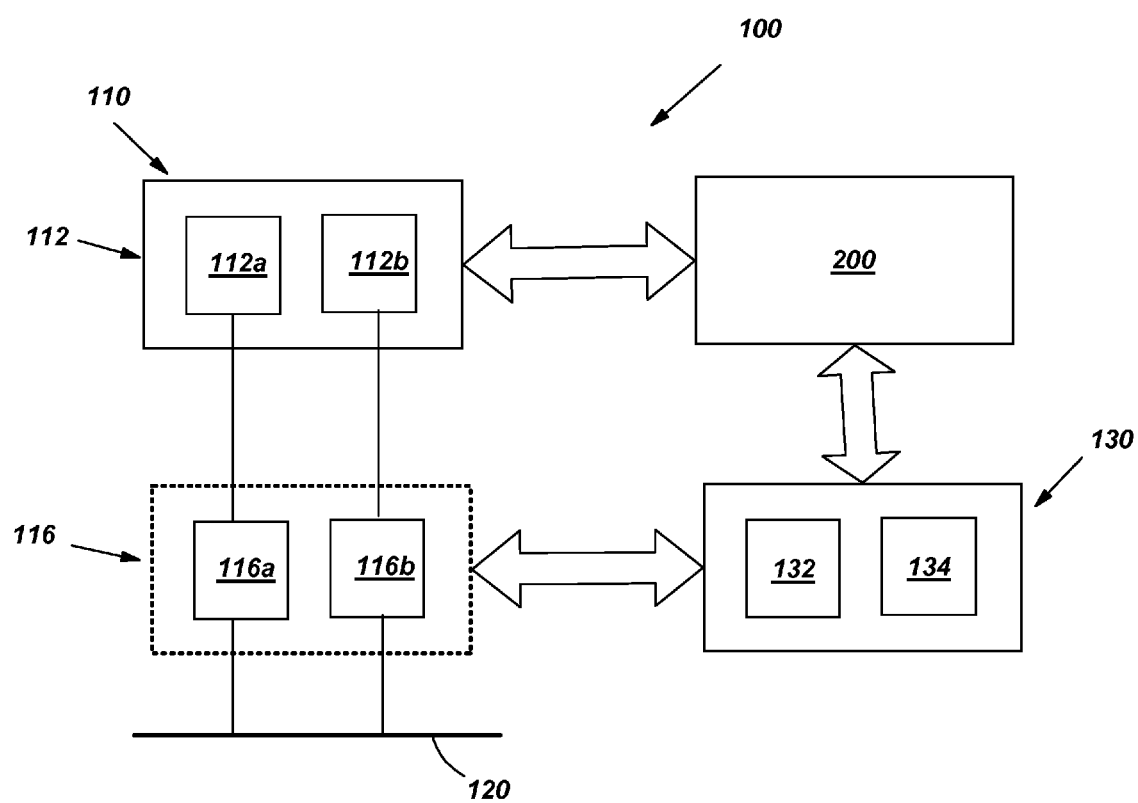
FIG. 2 shows a schematic diagram of one embodiment of an implementation system according to the invention.

FIG. 2 shows a schematic diagram of one embodiment of an implementation system 100 for detecting a history state of data in a data retaining device 112. As shown in FIG. 2, data retaining sub-system 110, e.g., a multi-port cache, includes multiple data retaining devices 112 (112a, 112b), e.g., ports of cache 110. Each data retaining device 112 (112a, 112b) is coupled to a PD SOI field-effect-transistor (FET) 116 (116a, 116b, respectively). PD SOI FETs 116 are used as pass gates so that accesses to data retaining devices 112a, 112b by access line 120 are controlled/through PD SOI FETs 116a, 116b, respectively. A state of PD SOI FET 116 may be measured by measurer 132 of monitoring device 130, the state indicating a body voltage of the PD SOI FET 116, and the measurement results of different PD SOI FETs 116 may be compared in comparator 134. Measurer 132 may be any now known or later developed devices that can measure, inter alia, a state of a PD SOI FET 116 including, but not limited to, a body voltage, a threshold voltage, or a subthreshold leakage current of the PD SOI FET 116. According to one embodiment, PD SOI FETs 116 are tuned to be of the same size to facilitate processing and a comparison between the states, e.g., body voltages, of different PD SOI FETs 116. However, any choices of PD SOI FETs 116 with different sizes are also included in the current invention, and methods may be taken to make the states of PD SOI FETs 116a, 116b comparable.

Monitoring device 130 is responsive to a computer system 200. Specifically, computer system 200 controls monitoring device 130 in performing, inter alia, the above-mentioned measurement and comparison, and receives measurement and comparison results from monitoring device 130. Upon processing the measurement and/or comparison results, computer system 200 may determine an action to be performed upon data retaining devices 112, and may control data retaining sub-system 110 to do the same. For example, computer system 200 may determine which data retaining device(s) 112 of data retaining sub-system 110 needs to be refreshed.

It is appreciated that the units of system 100 may reside at separate physical locations or at a single physical location. In addition, components or functions of one unit of system 100 may be integrated into other units. For example, the functions of comparator 134 may be performed by computer system 200, as will be described later. Details of computer system 200 will be described below.

3. Computer System

Figure 3:
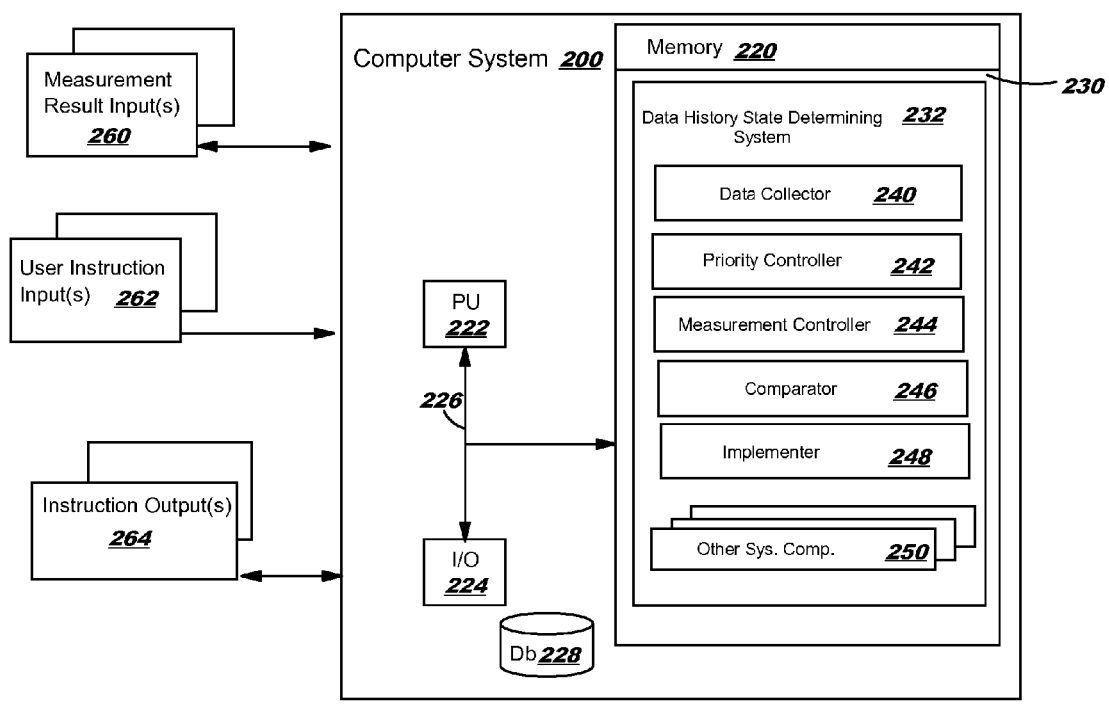
FIG. 3 shows a block diagram of an illustrative computer system according to one embodiment of the invention.

FIG. 3 shows a block diagram of an illustrative computer system 200 according to one embodiment of the invention. In one embodiment, computer system 200 includes a memory 220, a processing unit (PU) 222, input/output devices (I/O) 224 and a bus 226. A database 228 may also be provided for storage of data relative to processing tasks. Memory 220 includes a program product 230 that, when executed by PU 222, comprises various functional capabilities described in further detail below. Memory 220 (and database 228) may comprise any known type of data storage system and/or transmission media, including magnetic media, optical media, random access memory (RAM), read only memory (ROM), a data object, etc. Moreover, memory 220 (and database 228) may reside at a single physical location comprising one or more types of data storage, or be distributed across a plurality of physical systems. PU 222 may likewise comprise a single processing unit, or a plurality of processing units distributed across one or more locations. I/O 224 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 200.

As shown in FIG. 3, program product 230 may include a data history state determining system 232 that includes a data collector 240; a priority controller 242; a measurement controller 244; a comparator 246; an implementer 248; and other system components 250. Other system components 250 may include any now known or later developed parts of a computer system 200 not individually delineated herein, but understood by those skilled in the art.

Inputs to computer system 200 include measurement result inputs 260 and user instruction inputs 262. Measurement result inputs 260 may include measurement (and/or comparison) results of monitoring device 130 regarding, e.g., a state of a PD SOI FET 116 (FIG. 2). User instruction inputs 262 include instructions of a user of computer system 200 regarding the operation of, inter alia, data history state determining system 232. For example, a user may instruct priority controller 242 with respect to a priority of a data retaining device 112. These inputs may be obtained by data collector 240, and may be saved in database 228. Outputs of computer system 200 include instruction outputs 264 that are communicated to, inter alia, data retaining sub-system 110 to perform an action on data retaining devices 112, e.g., refreshing data retaining devices 112.

Figure 4:
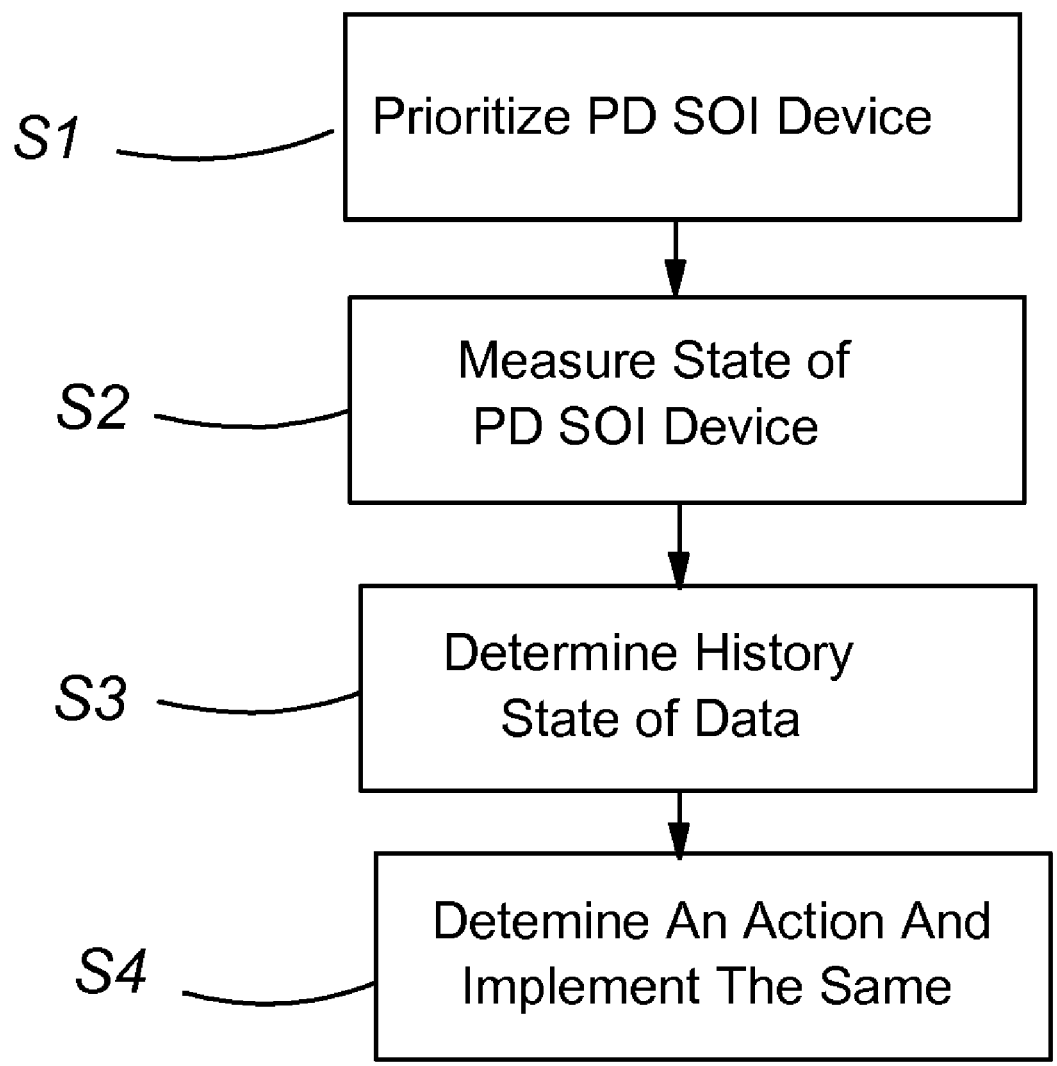
FIG. 4 shows a flow diagram of one embodiment of an operation of a data history state determining system according to one embodiment of the invention.

FIG. 4 shows a flow diagram of one embodiment of an operation of data history state determining system 232 according to one embodiment of the invention. As stated above, a history state of data refers to a state of the data regarding any activities and inactivities (idling) that have been involved with the data since the data was stored in a data retaining device 112 (FIG. 2). In the following description of the invention, an idling period of data in a data retaining device 112 (also an idling period of the data retaining device), i.e., a period that the data is not accessed, will be used as an illustrative example of a history state of the data. It is appreciated that determining of other history states of data in a data retaining device is similarly included in the current invention.

Referring to FIGS. 2-4, in step S1, priority controller 242 prioritizes PD SOI FETs 116 (FIG. 2) according to determined/obtained priorities of data retaining devices 112 coupled to PD SOI FETs 116. Any methods for determining/obtaining a priority of a data retaining device (DRD) 112 are included in the current invention. For instance, according to one embodiment, the priority of a data retaining device 112 may be communicated directly by a user through user instruction input(s) 262 to data collector 240. According to an alternative embodiment, priority controller 242 determines a priority of a data retaining device 112 based on a policy preset by a user. For example, a policy may stipulate that a data retaining device 112 with a certain type of data stored therein shall have a priority. In this case, if priority controller 242 detects that the type of data is contained in a data retaining device 112, priority controller 242 will set a priority to that specific data retaining device 112. In the following description, it is assumed that priority controller 242 has determined/set data retaining device 112a (FIG. 2) has a priority over data retaining device 112b, for illustrative purposes.

Various methods may be used to prioritize PD SOI FET 116a that is coupled to data retaining device 112a with a priority as described above. According to one embodiment, a decay rate of PD SOI FET 116a may be controlled so that the body voltage of PD SOI FET 116a will decay more slowly than the body voltage of PD SOI FET 116b that is coupled to data retaining device 112b with no priority. For example, a dislocation or a controlled degradation of the source and drain diodes of PD SOI FET 116a may change the decay rate of the body voltage of PD SOI FET 116a. As such, in the case that PD SOI FET 116a and PD SOI FET 116b have idled for a same period of time, body voltage of PD SOI FET 116a will decay less than the body voltage of PD SOI FET 116b (except that body voltages of both have decayed completely). As a consequence, a comparison between the body voltages of PD SOI FETs 116a and 116b will choose data retaining device 112b (with no priority) as the one that has idled "longer" and needs to be, e.g., refreshed. According to an alternative embodiment, a weight factor may be assigned to a measured state of PD SOI FET 116a that indicates the body voltage of the same. As such, in the case that PD SOI FETs 116a, 116b have been idled for a same period of time, and body voltages of PD SOI FETs 116a and 116b have decayed to the same value, the assigned weight factor will differentiate PD SOI FET 116a from PD SOI FET 116b and make data retaining device 112b (with no priority) as the one that has idled "longer" and needs to be refreshed. The results of the prioritizing by priority controller 242 may be communicated to, e.g., a user through instruction outputs 264 to tune PD SOI FETs 116, or may be communicated to comparator 246 as a weight factor.

Next in step S2, measurement controller 244 controls measurer 132 to measure a state of a PD SOI FET 116 that indicates a body voltage of the PD SOI FET 116. Any states of a PD SOI FET 116 that can indicate, directly or indirectly, a body voltage of the PD SOI FET 116 may be measured by measurer 132. According to one embodiment, a subthreshold leakage current of a PD SOI FET 116 may be measured as an indicator of the body voltage of the same. As has been described above, a subthreshold leakage current of a PD SOI FET 116 varies in the same direction as a body voltage of the PD SOI FET 116 does. That is, the subthreshold leakage current increases with an increase in the body voltage, and decreases with a decrease in the body voltage. One advantage of measuring the subthreshold leakage current as an indicator of the body voltage of a PD SOI FET 116 is that it will not corrupt the body voltage. As is appreciated, based on the current state of the art technology, measuring a body voltage of a PD SOI directly will corrupt (e.g., change) the body voltage, which is not preferable. Various methods may be used to measure a subthreshold leakage current of a PD SOI FET 116, and all are included in the current invention. As details of such a measurement are not necessary for an understanding of the current invention, no further details will be provided.

Next in step S3, comparator 246 determines a history state of data stored in data retaining devices 112a, 112b based on the measured state of PD SOI FETs 116a, 116b, respectively. According to one embodiment, comparator 246 first weighs the measured state of each PD SOI FET 116 according to a weight factor (if any) preset by priority controller 242 in step S1. Next, comparator 246 compares the weighted measurement results of all the PD SOI FETS 116 of concern to determine, e.g., a PD SOI FET 116 that has idled/decayed for a longest time (with consideration of the weight factor, as is appreciated). Different standards may be used in the determination for different circuit designs involving PD SOI FETs 116. Specifically, in the case that body voltage equilibriums of PD SOI FETs 116 are designed to drift to a positive power supply (VDD), comparator 246 selects a PD SOI FET 116 with the highest weighted subthreshold leakage current as the one that has decayed/idled for the longest time. On the other hand, in the case that body voltage equilibriums of PD SOI FETs 116 are designed to drift to a ground (GND), comparator 246 selects a PD SOI FET 116 with the lowest weighted subthreshold leakage current as the one that has decayed/idled for the longest time. Please note again that a subthreshold leakage current changes in the same direction as a body voltage of a PD SOI device. The history state, here, e.g., the idling period, of data stored in data retaining devices 112a, 112b may be determined based on the period of idling/decay of PD SOI FETS 116a, 116b, respectively, as the idle periods of PD SOI FETs 116a, 116b indicate the periods during which data stored in data retaining devices 112a, 112b, respectively are not accessed, i.e., idling.

According to an alternative embodiment, comparator 246 compares the weighted measurement results of the state of PD SOI FETs 116 to a preset threshold. If the weighted measurement result of the state of a PD SOI FET 116 meets the threshold, a history state of the data in the data retaining device 112 coupled to the PD SOI FET 116 is considered as meeting a threshold to be taken actions upon. For example, comparator 246 may compare a period of idling/decay of a PD SOI FET 116, which may be indicated by the measured subthreshold leakage current, to a preset threshold for a period of idling.

It is appreciated that the function of comparator 246 of computer system 200 may also be performed by comparator 134 of monitoring device 130, as a hardware implementation. For example, comparator 134 may be a hardware comparator or a current mirror to compare the subthreshold leakage currents of PD SOI FETs 116.

Next in step S4, implementer 248 determines an action upon a data retaining device 112 based on the determined history state of data stored therein, and controls data retaining sub-system 110 to implement the action. For example, implementer 248 may determine to refresh the data retaining device 112 with data that has not been accessed for the longest period among all data retaining devices 112 of concern. Moreover, in the case that comparator 246 cannot yield a valid result of comparison, e.g., the weighted subthreshold leakage currents of two PD SOI FETs 116a, 116b are the same, implementer 248 will determine an action based on other standards, e.g., priority of data retaining devices 112a, 112b.

Figure 5:
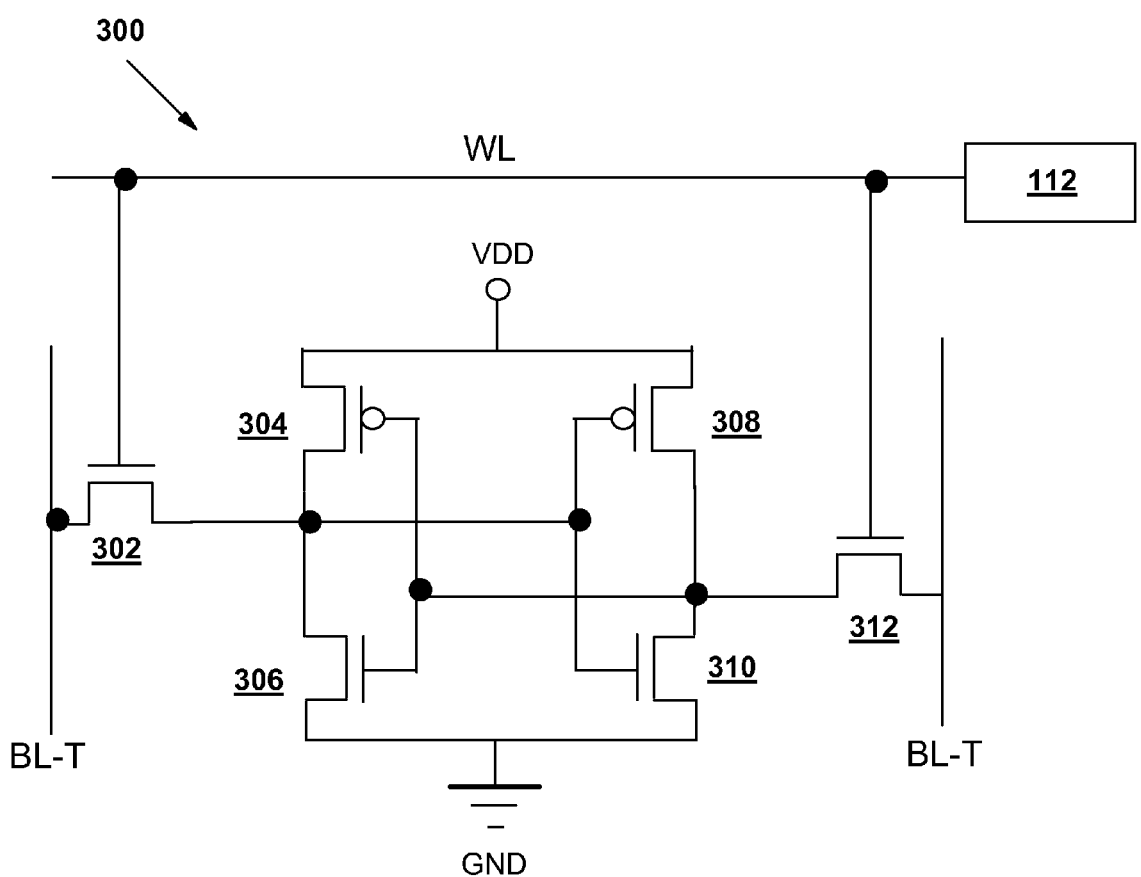
FIG. 5 shows a six-transistor static random access memory (SRAM) including multiple PD SOI FETs according to one embodiment of the invention.

The above description uses PD SOI FETs 116 acting as pass gates to data retaining devices 112 (FIG. 2) only as illustrative examples of PD SOI devices that are coupled to data retaining devices 112. It should be appreciated that other types of PD SOI devices are also included in the current invention. For example, a PD SOI device may include multiple PD SOI FETs that are coupled together in a static random access memory (SRAM). FIG. 5 shows a six-transistor SRAM 300 including PD SOI FETs 302, 304, 306, 308, 310 and 312. In SRAM 300, after SRAM 300 sits idle for a long time in the same state, the balance of forward and reverse diode leakage currents establishes an equilibrium static body voltage which is a function of the source and drain voltages of each PD SOI FET 302, 304, 306, 308, 310 and 312. As a consequence, the body voltage of one side of SRAM 300 goes high and the body voltage of the other side goes low, which causes an increases in the subthreshold leakage current.

4. Conclusion

While shown and described herein as a method and system for determining a history state of data in a data retaining device, it is understood that the invention further provides various alternative embodiments. For example, in one embodiment, the invention provides a program product stored on a computer-readable medium, which when executed, enables a computer infrastructure to determine a history state of data in a data retaining device. To this extent, the computer-readable medium includes program code, such as data history state determining system 232 (FIG. 3), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 220 (FIG. 3) and/or database 228 (FIG. 3), and/or as a data signal traveling over a network (e.g., during a wired/wireless electronic distribution of the program product).

In another embodiment, the invention provides a method of generating a system for determining a history state of data in a data retaining device. In this case, a computer infrastructure, such as computer system 200 (FIG. 3), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 200 (FIG. 3), from a computer-readable medium; (2) adding one or more computing devices to the computer infrastructure; and (3) incorporating and/or modifying one or more existing systems of the computer infrastructure, to enable the computer infrastructure to perform the process steps of the invention.

In still another embodiment, the invention provides a business method that performs the process described herein on a subscription, advertising supported, and/or fee basis. That is, a service provider could offer to determine a history state of data in a data retaining device as described herein. In this case, the service provider can manage (e.g., create, maintain, support, etc.) a computer infrastructure, such as computer system 200 (FIG. 3), that performs the process described herein for one or more customers and communicates the results of the data history state determination to the one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A system for determining a history state of data in a data retaining device, the system comprising:

means for measuring a state of a partially-depleted silicon-on-insulator (PD SOI) device that is coupled to the data retaining device, the state indicating a body voltage of the PD SOI device; and means for determining the history state of the data in the data retaining device based on the measured state of the PD SOI device.

2. The system of claim 1, wherein the state measuring means measures a subthreshold leakage current of the PD SOI device.

3. The system of claim 1, wherein the history state determining means determines whether the PD SOI device has been idling for a period longer than at least one of:
   a period of idling of another different PD SOI device coupled to another different data retaining device; and
   a preset threshold for a period of idling.

4. The system of claim 1, further including means for prioritizing the PD SOI device based on a provided priority of the data retaining device.

5. The system of claim 4, wherein the PD SOI prioritizing means performs at least one of:
   controlling a decay rate of the PD SOI device; and
   assigning a weight factor to a state measurement result of the PD SOI device.

6. The system of claim 1, further comprising means for determining an action upon the data retaining device based on the determined history state of the data in the data retaining device.

7. The system of claim 1, wherein the PD SOI device includes multiple PD SOI field-effect-transistors (FET), the multiple PD SOI FETs being coupled together in a static random access memory.

\* \* \* \* \*

UNITED STATES PATENT AND TRADEMARK OFFICE
CERTIFICATE OF CORRECTION

PATENT NO. : 7,460,422 B2
APPLICATION NO. : 11/279507
DATED : December 2, 2008
INVENTOR(S) : Kerry Bernstein et al.

Page 1 of 1

It is certified that error appears in the above-identified patent and that said Letters Patent is hereby corrected as shown below:

On the Title page, item [75]:

Inventors: Clearence R. Ogilvis should be Clarence R. Ogilvie and
Kelth R. Williams should be Keith R. Williams Signed and Sealed this Twentieth Day of January, 2009

JON W. DUDAS
*Director of the United States Patent and Trademark Office*